(12) United States Patent
Rohrbaugh et al.

(10) Patent No.: US 6,895,562 B2
(45) Date of Patent: May 17, 2005

(54) PARTITIONING INTEGRATED CIRCUIT HIERARCHY

(75) Inventors: John G Rohrbaugh, Ft Collins, CO (US); Jeff Rearick, Ft Collins, CO (US); Daryl H Allred, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 102 days.

(21) Appl. No.: 10/228,913

(22) Filed: Aug. 27, 2002

(65) Prior Publication Data

US 2004/0044972 A1 Mar. 4, 2004

(51) Int. Cl.$^7$ ............................................. G06F 17/50
(52) U.S. Cl. ............................................. 716/2; 716/3
(58) Field of Search .......................... 716/2, 1, 3–21

(56) References Cited

U.S. PATENT DOCUMENTS

| | | | | |
|---|---|---|---|---|
| 2001/0010090 A1 | * | 7/2001 | Boyle et al. | 716/2 |
| 2001/0013113 A1 | * | 8/2001 | Matsunaga | 716/3 |
| 2003/0069722 A1 | * | 4/2003 | Beattie et al. | 703/14 |
| 2003/0079190 A1 | * | 4/2003 | Parashkevov et al. | 716/4 |
| 2003/0088393 A1 | * | 5/2003 | Leonhardt | 703/14 |
| 2003/0200519 A1 | * | 10/2003 | Argyres | 716/6 |
| 2004/0078767 A1 | * | 4/2004 | Burks et al. | 716/8 |

* cited by examiner

Primary Examiner—A. M. Thompson
Assistant Examiner—Magid Y. Dimyan (57) ABSTRACT

A method and apparatus of carrying out a computer assisted analysis function on a hierarchical circuit model. The method is carried out by inputting the hierarchical circuit model, specifying at least one circuit block within the hierarchy as a target of the function on the target block, and simplifying the hierarchical circuit model by deleting circuit blocks not affecting the analysis function, to produce a simplified hierarchical circuit model. A computer assisted analysis function can then be carried out on the simplified hierarchical circuit model. The model is simplified by carrying out a block by block analysis of the hierarchical circuit model to determine if a circuit block is a circuit block desired in the computer assisted analysis and if so keeping the circuit block as part of the simplified hierarchical circuit model; and by carrying out a block by block analysis of the hierarchical circuit model to determine if a circuit block comprises a parent circuit block containing a child circuit block desired in the computer assisted analysis and if so keeping the parent circuit block as part of the simplified hierarchical circuit model.

43 Claims, 5 Drawing Sheets

PARTITIONING INTEGRATED CIRCUIT HIERARCHY

FIELD OF THE INVENTION

This invention relates generally to the field of electronic circuit modeling. More particularly, this invention relates to modeling hierarchical circuits by eliminating blocks of circuitry that are irrelevant to application of a particular tool.

BACKGROUND OF THE INVENTION

Integrated circuits (ICs) are often represented by models that represent their netlist connectivity or functional behavior. For hierarchically designed integrated circuits, a model is made up of a hierarchy of circuit blocks. When a tool, such as a circuit analysis tool, is used to carry out an action (e.g. circuit analysis, simulation or design tools) on the circuit model, the entire model is generally used in the action. With large and complex integrated circuits, this means that the analysis or other action carried out by the tool operates on an extremely large body of data. This can be the case, even when there is only a small portion of the circuit that is relevant to the particular action of the tool. This can result in the need for enormous amounts of computing time and memory to carry out a given analysis (on the order of days of computing time is not an unreasonable estimate in some cases).

BRIEF SUMMARY OF THE INVENTION

The present invention relates generally to partitioning of a hierarchical integrated circuit and methods therefor. Objects, advantages and features of the invention will become apparent to those skilled in the art upon consideration of the following detailed description of the invention.

In one embodiment consistent with certain embodiments of the present invention, a method and apparatus of carrying out a computer assisted function on a hierarchical circuit model is described. The method is carried out by reading the hierarchical circuit model and simplifying the hierarchical circuit model by deleting circuit blocks not affecting the analysis function, to produce a simplified hierarchical circuit model. A computer assisted function can then be carried out on the simplified hierarchical circuit model. The model can be simplified by identifying at least one circuit block within the hierarchical circuit model as a target block of a function; carrying out a hierarchical analysis of the circuit model to determine which blocks are dependent on the target block and keeping the dependent blocks as part of the simplified hierarchical model.

A method of carrying out a computer assisted function on a hierarchical circuit model, consistent with certain embodiments of the present invention involves reading the circuit model; specifying at least one circuit block within the hierarchy as a target block of the function; simplifying the hierarchical circuit model by deleting circuit blocks not affecting the function of the target block, to produce a simplified hierarchical circuit model; and carrying out the computer assisted function on the simplified hierarchical circuit model.

An electronic circuit analysis system, consistent with certain embodiments of the invention has a processor. A memory stores a hierarchical model of a circuit to be analyzed. An input receives a list of desired circuit blocks for use in a computer assisted function. A program running on the processor simplifies the hierarchical model of the circuit to retain only the desired circuit blocks and circuit blocks containing the desired circuit blocks, to create a simplified hierarchical circuit model by: reading the circuit model; specifying at least one circuit block within the hierarchy as a target block of the function; simplifying the hierarchical circuit model by deleting circuit blocks not affecting the function of the target block, to produce a simplified hierarchical circuit model.

Many variations, equivalents and permutations of these illustrative exemplary embodiments of the invention will occur to those skilled in the art upon consideration of the description that follows. The particular examples above should not be considered to define the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Figure 1:
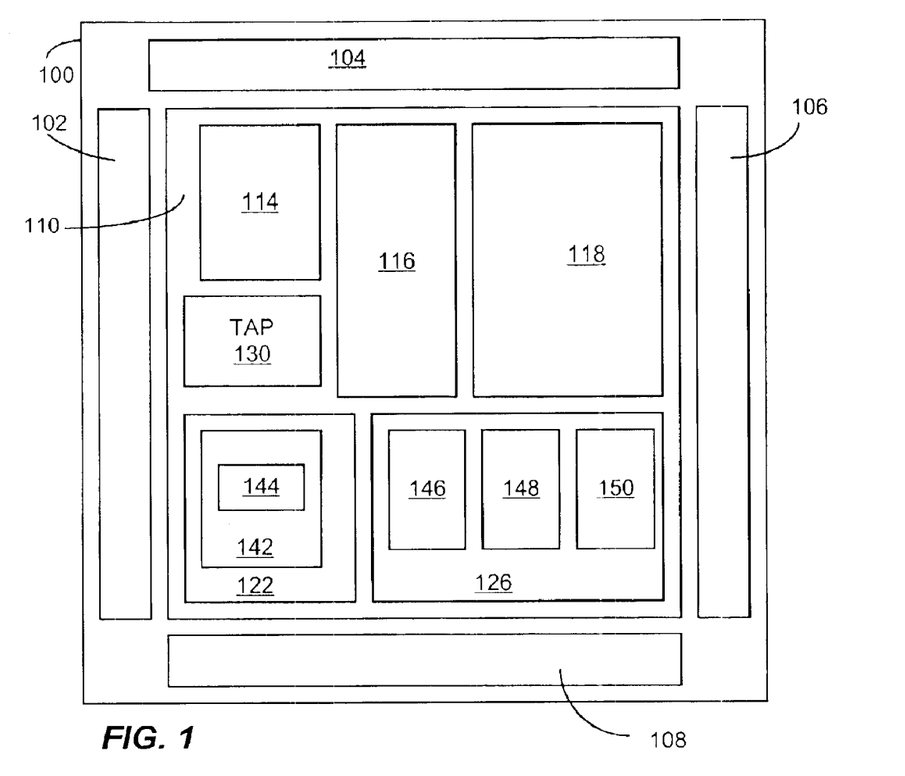
FIG. 1 illustrates an exemplary hierarchical integrated circuit consistent with certain embodiments of the present invention.

Turning now to FIG. 1, an integrated circuit is illustrated in which the integrated circuit's hierarchy is depicted by numbered circuit blocks. At the highest level of the hierarchy is block 100 followed by circuit blocks 102, 104, 106, 108 and 110. In this example, circuit blocks 102, 104, 106 and 108 may represent the integrated circuit's pads, one use of which is boundary scan testing, (as defined in IEEE 1149.1). Circuit blocks 102, 104, 106 and 108, of the present example, have no sub-blocks (or child blocks) in the hierarchy. Circuit block 110 constitutes the core of this example integrated circuit and has six sub-blocks 114, 116, 118, 122, 126 and 130. As illustrated, circuit block 130 may represent the TAP (test access port—as defined by IEEE 1149.1). Circuit blocks 114, 116, 118 and 130 have no sub-blocks in this example. Circuit block 122 has one sub-block 142 which has a sub-block 144. Circuit block 126 has three sub-blocks 146, 148 and 150, all at the same hierarchy level. Those skilled in the art will recognize that this hierarchical circuit of FIG. 1 is an extremely simple hierarchy and that some circuits might have hundreds of levels and thousands of circuit blocks.

Figure 2:
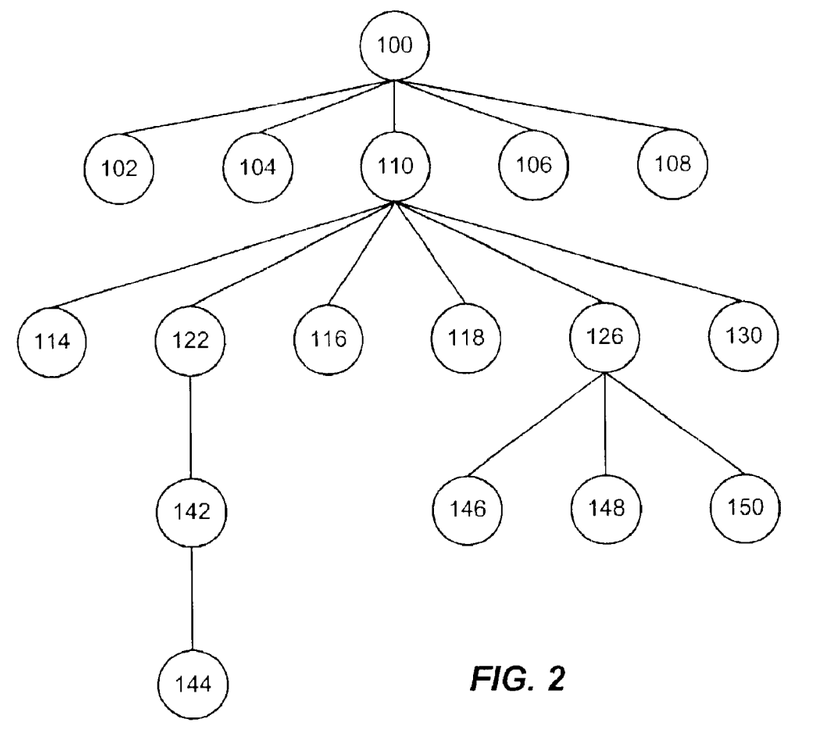
FIG. 2 is a hierarchical tree diagram showing the hierarchy of integrated circuit 100 consistent with certain embodiments of the present invention.

This hierarchy of the circuit can be depicted in a tree form as illustrated in FIG. 2, with each level in the hierarchy depicted as a row of circles. The lines interconnecting the circles represents a parent-child or block-sub-block relationship. By representing the hierarchy in this manner, one can readily see that an analysis of portions of the circuit may not require that the entire circuit be modeled for purposes of the analysis (or other action carried out by a suitable tool). For example, an analysis of circuit block 146 may not require that circuit block 148 and 150 be modeled. Moreover, circuit blocks 102, 104, 106, 108, 114, 122, 116, 118, 130, 142 and 144 may not be needed. In this example, only circuit blocks 146, 126 and 110 may be needed to accurately model the actions of circuit block 146. While this is a simple example, it illustrates the point that certain of the circuit blocks may be omitted from an analysis without affecting the accuracy of the results.

Figure 3:
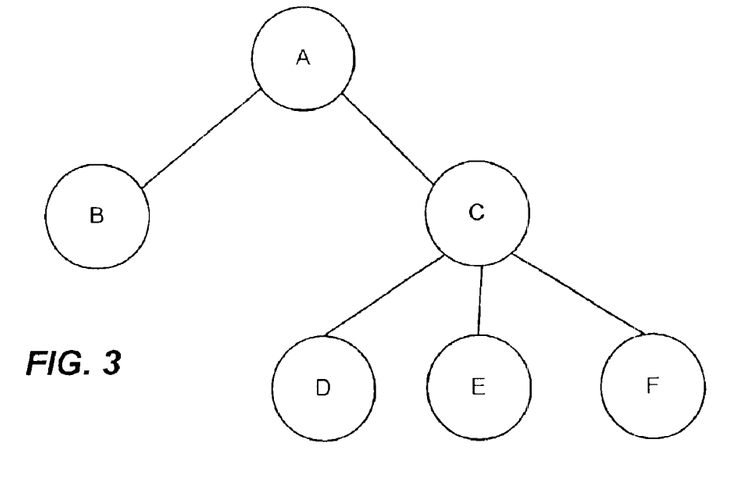
FIG. 3 is another hierarchical tree diagram of an exemplary integrated circuit consistent with certain embodiments of the present invention.

Referring now to FIG. 3, consider an even simpler example of a circuit having six circuit blocks in three levels of hierarchy as shown. A pseudocode representation of this circuit might be:

```
module F ( )
    # Much detail deleted
endmodule
module E ( )
    # Much detail deleted
endmodule
module D ( )
    # Much detail deleted
endmodule
module C ( )
    # Much detail deleted
    D D( )
    E E( )
    F F( )
endmodule
module B ( )
    # Much detail deleted
endmodule
module A ( )
    # Much detail deleted
    B B( )
    C C( )
endmodule
```

In this example, module A is the top level parent. The children of A are B and C. The children of C are D, E, and F. If this circuit is to be partitioned so that it contains only B and E, the result is a terse hierarchy like this:

```
A
  B
  C
    E
```

This can be accomplished using an algorithm represented by the following pseudocode:

```
Read list of desired blocks
Read circuit model
Create hierarchy tree
Traverse down hierarchy, starting at top level parent
    If child block contains a desired block, then keep it and traverse
its child blocks
        If child block is a desired block, then keep it
        else delete child block
    Output all kept blocks
End
```

This produces an output that represents the entire list of desired circuit blocks plus the hierarchy above. Note that this algorithm assumes that the dependencies between blocks are based only on hierarchy. While this is sometimes the case, there may be additional dependencies based on block input/output connectivity. For example, in the sample hierarchy above, the algorithm implicitly assumes that the inputs and outputs of module B are exclusively connected to its parent, module A. But it is entirely possible that module B might receive an input from module C or send an output to module C. This could be determined, for example, by performing logic cone analysis on all IOs of module B.

Figure 4:
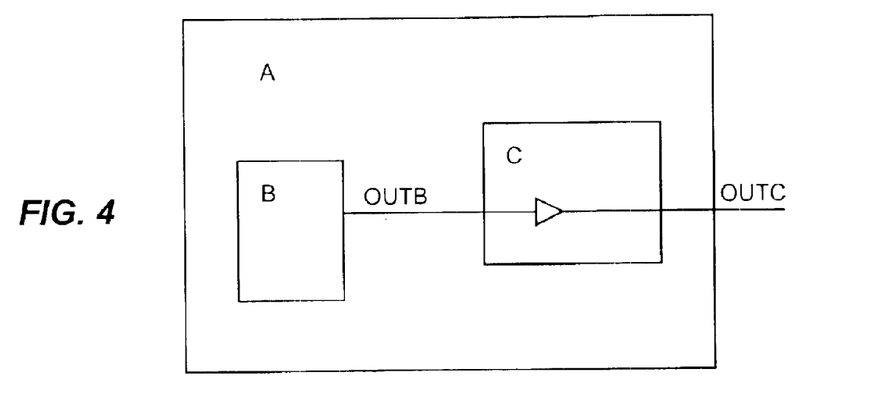
FIG. 4 illustrates a simple circuit hierarchy to be repartitioned in a manner consistent with certain embodiments of the present invention.
Figure 5:
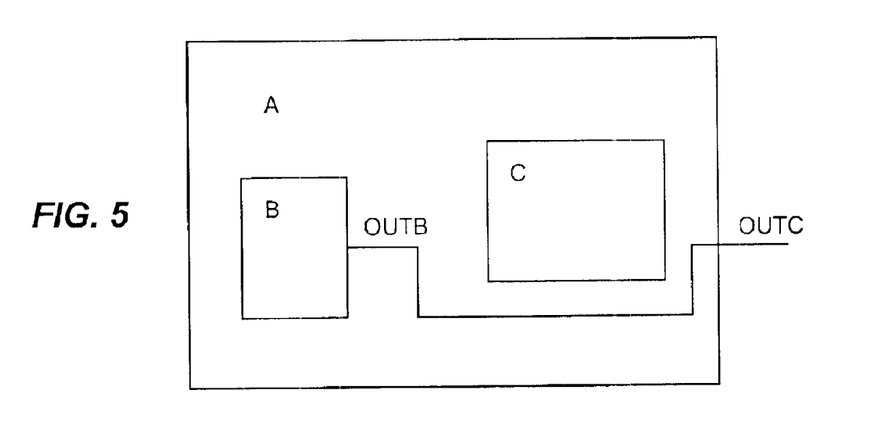
FIG. 5 illustrates the simple hierarchy of FIG. 4 after it has been simplified in a manner consistent with certain embodiments of the present invention.
Figure 6:
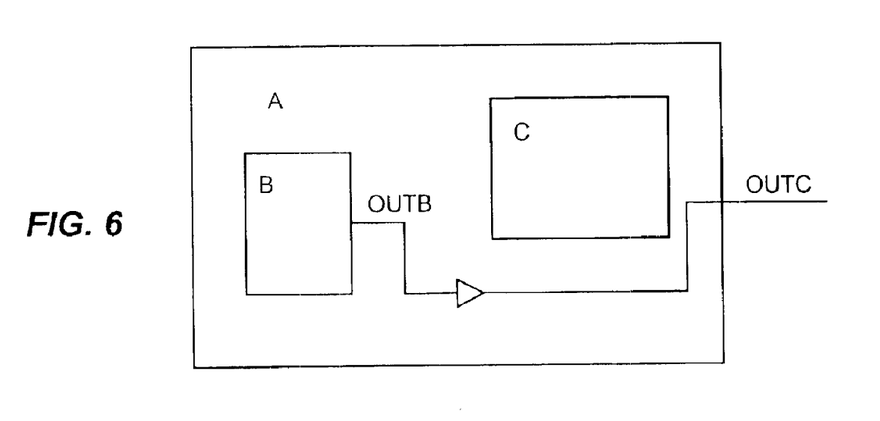
FIG. 6 illustrates the simple hierarchy of FIG. 4 after it has been repartitioned in another manner consistent with certain embodiments of the present invention.

Furthermore, it is also possible that dependencies based on IO connectivity are unnecessary. For example, consider the circuit depicted in FIG. 4 having three modules A, B and C as shown. Assume that the afore-mentioned module B does indeed send an output, OUTB, to module C. As OUTB enters module C, it passes through a buffer and becomes OUTC, which is then sent out of module C to the parent, module A, and in this example, becomes an output of module A called OUTC. If the desired function depends only on boolean logic, then the buffer has no effect and both the buffer and the connection through module C can be removed. This could be accomplished by performing logic-based simplification on the circuit model as shown in FIG. 5. Alternately, even if the buffer is required for the desired function, it is possible to remodel the circuit so that the buffer is removed from module C and becomes a part of module A or B as shown in FIG. 6 with the buffer becoming a part of module A. This is an example of repartitioning of the hierarchy.

To summarize, either of at least two techniques can be used to take additional dependencies into account: 1) require that the two inputs to this process, the list of desired blocks and the circuit model, account for all non-hierarchical dependencies, or 2) preprocess the circuit model to minimize non-hierarchical dependencies and then analyze the preprocessed model to ensure that all remaining non-hierarchical dependencies are accounted for by adding additional blocks (i.e., connectivity analysis such as logic cone analysis).

In the approaches previously described, logic simplification and repartitioning the hierarchy could be approaches used in preprocessing the model, and logic cone analysis could be used to identify dependencies based on connectivity. These processes are well-known by those skilled in the state-of-the-art, but for completeness, here is a brief description of each:

Logic cone analysis deals with circuit connectivity. This is most applicable for a directional circuit model. In this case, each node in the circuit model has an input logic cone and an output logic cone. The input logic cone is the set of all primary inputs and/or scan outputs found by tracing backward from the node through logic. Conversely, the output logic cone is the set of all primary outputs and/or scan inputs found by tracing forward from the node through logic. In both cases, the tracing continues through all logic gates, but stops when either a primary input/output or a flip-flop (scan input/output) is encountered.

For a given block and a given function:

If control of a block input signal is required for the function, then any other block which has an intersection with this signal's input logic cone is kept.

If observability of a block output signal is required for the function, then any other block which has an intersection with this signal's output logic cone is kept.

Logic-based simplification eliminates unnecessary logic from circuits. Several examples of logic-based simplification include, but are not limited to, the following. Logic can become unnecessary if one or more inputs are tied to logic one or logic zero. Buffers do not contribute to logic functions, nor do strings of inverter pairs. Redundant logic can also be eliminated.

Repartitioning hierarchy is the process of taking existing hierarchy and rearranging it in a way which is more convenient for one or more desired functions. Any suitable technique for repartitioning can be utilized without departing from the present invention.

Figure 7:
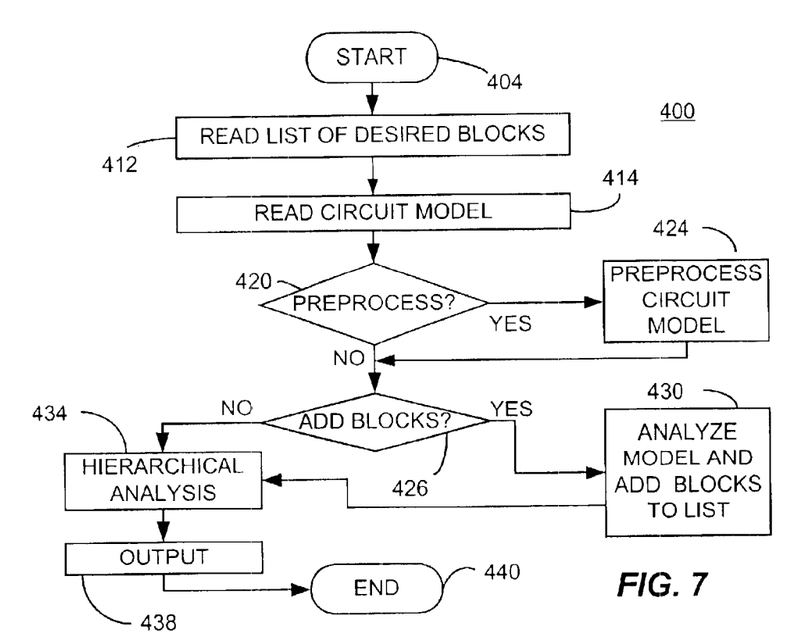
FIG. 7 is a flow chart depicting an overall analysis process consistent with certain embodiments of the present invention.

The algorithm described above in pseudocode can be utilized in a circuit analysis operation or other action by a tool on a netlist or other representation of a circuit as illustrated in FIG. 7. The process 400 depicted in FIG. 7 starts at 404 and a list of the desired circuit blocks is read at 412. At 414, the circuit model is read. If the model is to be simplified at 420, the model is to be preprocessed by a simplification process to simplify the circuit model at 424. If blocks are to be added to the model at 426, the model is analyzed at 430 and blocks are added to the list. At 434, a hierarchical analysis is carried out on the circuit model (e.g., as represented by a netlist describing the hierarchical circuit). When the hierarchical analysis is complete at 434, the output is provided at 438 and the process ends at 440.

Figures 8, 9:
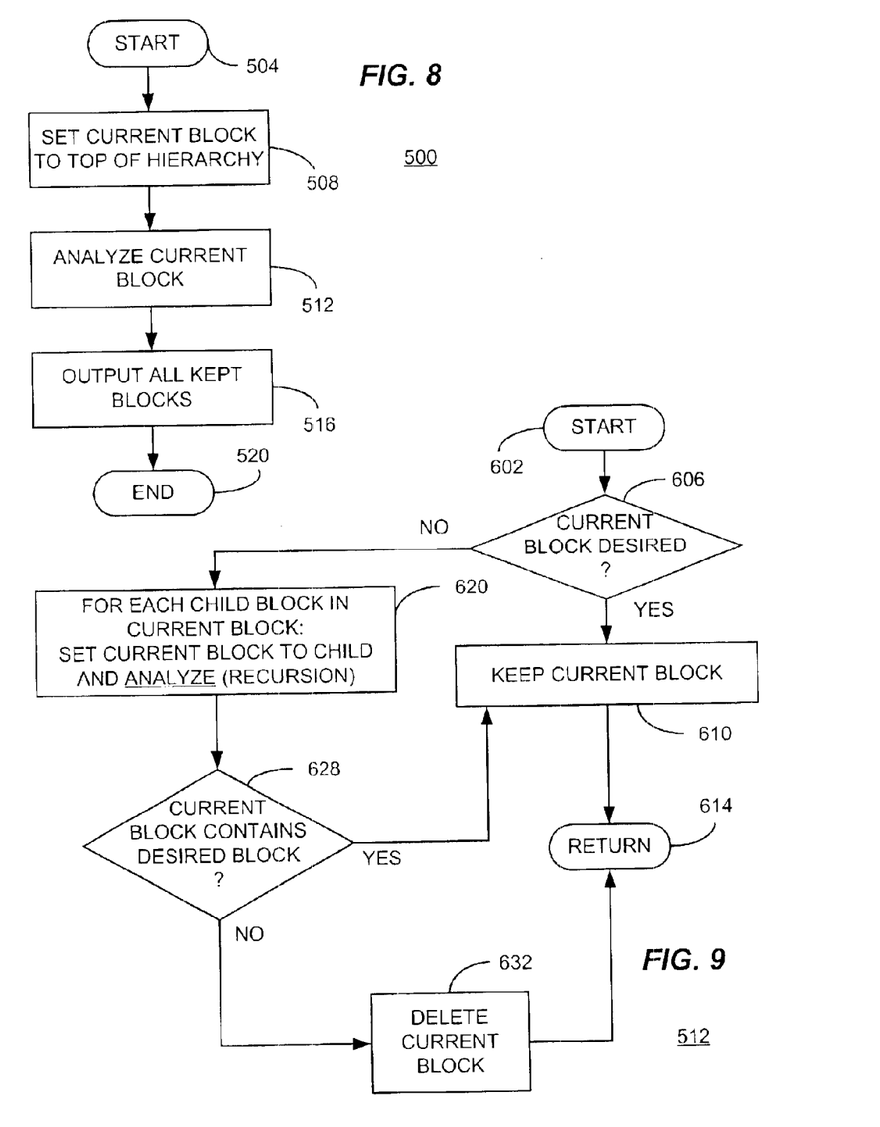
FIG. 8 is a flow chart of a main routine of a circuit simplification process consistent with certain embodiments of the present invention.
FIG. 9 is a flow chart of a recursive analysis routine of a circuit simplification process consistent with certain embodiments of the present invention.

One embodiment of the hierarchical simplification process of 434 can be represented at a main process level by the process 500 of the flow chart of FIG. 8. When this routine is entered at 504, the current block is set to the top of the hierarchy at 508. The current block is then analyzed at 512 using an algorithm as will be described in connection with FIG. 9. This algorithm provides as its output all kept blocks in the simplified hierarchical model at 516 and the process ends at 520. The process can then return to 434 to complete an analysis or other action carried out by the computer system.

The analyze block 512 can be implemented, for example using a recursive routine such as that illustrated as process 512 of FIG. 9. Process 512 can be expressed algorithmically as follows:

```
Start
    If current block is desired
        Keep current block
    Else
        For each child block in current block
            Set current block to child
            Analyze current block with recursion of this routine
            If current block contains a desired block
                Keep current block
            Else
                Delete current block
Return results
```

It should be noted that this is a recursive algorithm. When the algorithm reaches the analyze statement, this is intended to represent a call of the current algorithm from the start. This process as depicted in FIG. 9 starts at 602 after which the current block is analyzed to determine if it is desired in the context of the computer function to be carried out on the simplified hierarchical model. If so, the block is kept at 610 and the process returns at 614. If not, each child block in the current block is analyzed by setting the current block to the child and recursively calling the current routine 512. Thus, at 620, this process restarts at 602 for each child block in the current block. It is act of the routine this calling of itself that defines the routine as being recursive.

Using this recursive process, all blocks in the hierarchy are eventually analyzed and either kept or deleted to form the simplified hierarchical model. Once the recursion is complete, control passes to 628. If the current block contains a desired block, the block is kept at 610, but if the current block is not a desired block, control passes to 632 and the current block is deleted. Retaining of the circuit block can be accomplished by simply maintaining a list identifying retained circuit blocks or using any other convenient mechanism.

Using this recursive process, all circuit blocks on all levels of the hierarchy can be analyzed, and a list of all of the kept circuit blocks is available and is the output of the routine for use by in the computer assisted process. Those skilled in the art will appreciate that the algorithm described can be implemented in any number of ways without departing from the invention. For example, rather than compiling a list of kept circuit blocks, a list of all circuit blocks can equivalently be trimmed by removal of deleted circuit blocks, without departing from the invention. Other variations will occur to those skilled in the art.

The above technique uses a recursive routine to traverse all blocks in the hierarchy. Other techniques can also be used including, but not limited to, an iterative process wherein a stack is used to keep track of the location in the hierarchy.

Figure 10:
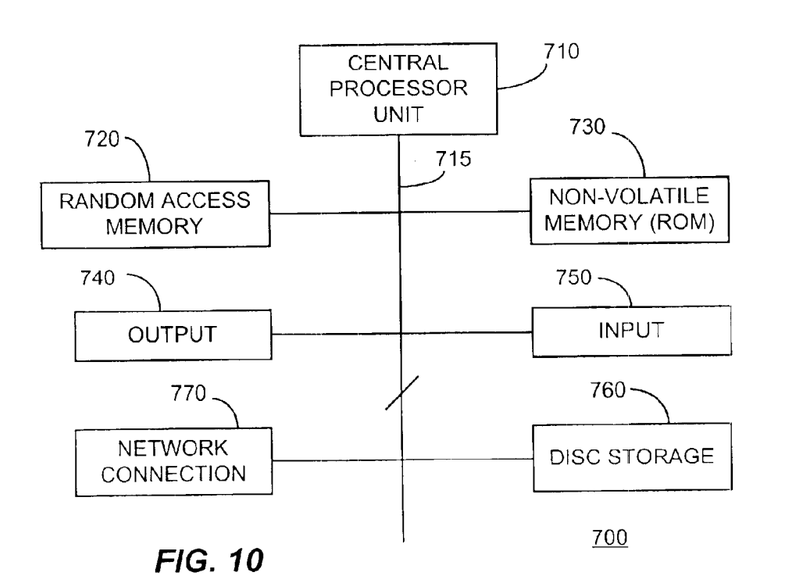
FIG. 10 is a block diagram of a computer system suitable for carrying out processes consistent with certain embodiments of the present invention.

The processes previously described can be carried out on a programmed general purpose computer system, such as the exemplary computer system 700 depicted in FIG. 10. Computer system 700 has a central processor unit (CPU) 710 with an associated bus 715 used to connect the central processor unit 710 to Random Access Memory 720 and/or Non-Volatile Memory 730 in a known manner. An output mechanism at 740 may be provided in order to display and/or print output for the computer user. Similarly, input devices such as keyboard and mouse 750 may be provided for the input of information by the computer user. Computer 700 also may have disc storage 760 for storing large amounts of information including, but not limited to, program files and data files. Computer system 700 may be is coupled to a local area network (LAN) and/or wide area network (WAN) and/or the Internet using a network connection 770 such as an Ethernet adapter coupling computer system 700, possibly through a fire wall.

Those skilled in the art will recognize that the present invention has been described in terms of exemplary embodiments based upon use of a programmed processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, microcontrollers, optical computers, analog computers, dedicated processors and/or dedicated hard wired logic may be used to construct alternative equivalent embodiments of the present invention.

The present invention, as described in embodiments herein, is implemented using a programmed processor executing programming instructions that are broadly described above in flow chart form that can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of carrying out a computer assisted function on a hierarchical circuit model, comprising:
    inputting the hierarchical circuit model as a hierarchy of interconnected circuit blocks;
    specifying at least one circuit block within the hierarchy of interconnected circuit blocks as a target block of the computer assisted function;
    simplifying the hierarchical circuit model by deleting circuit blocks within the hierarchy of interconnected circuits blocks not affecting operation of the target block with respect to the computer assisted function to produce a simplified hierarchical circuit model; and
    carrying out the computer assisted function on the simplified hierarchical circuit model.

2. The method according to claim 1, wherein simplifying comprises carrying out a circuit block by circuit block analysis of the hierarchical circuit model to determine if a circuit block is a circuit block desired in the computer assisted function and if so keeping the circuit block as part of the simplified hierarchical circuit model.

3. The method according to claim 1, wherein simplifying further comprises preprocessing the hierarchical circuit model to generate a preprocessed circuit model.

4. The method according to claim 3, wherein preprocessing comprises logic-based simplification of the hierarchical circuit model.

5. The method according to claim 4, wherein logic-based simplification of the hierarchical circuit model comprises removing buffers.

6. The method according to claim 4, wherein logic-based simplification of the hierarchical circuit model comprises collapsing serial inverter pairs.

7. The method according to claim 3, wherein simplifying comprises performing connectivity analysis on the preprocessed circuit model.

8. The method according to claim 7, wherein connectivity analysis comprises logic cone analysis.

9. The method according to claim 1, wherein simplifying comprises performing connectivity analysis on the hierarchical circuit model.

10. The method according to claim 9, wherein connectivity analysis comprises logic cone analysis.

11. The method according to claim 1, wherein specifying at least one circuit block further comprises specifying additional target blocks based on connectivity analysis of the previously specified target blocks.

12. The method according to claim 11, wherein connectivity analysis comprises logic cone analysis.

13. The method according to claim 1, wherein simplifying comprises carrying out a circuit block by circuit block analysis of the hierarchical circuit model to determine if a circuit block comprises a parent circuit block that contains a child circuit block desired in the computer assisted function and if so keeping the parent circuit block as part of the simplified hierarchical circuit model.

14. The method according to claim 1, wherein simplifying comprises carrying out a circuit block by circuit block analysis of the hierarchical circuit model to determine if a circuit block is a circuit block desired in the computer assisted function and if so keeping the circuit block as part of the simplified hierarchical circuit model; and carrying out a circuit block by circuit block analysis of the hierarchical circuit model to determine if a circuit block comprises a parent circuit block containing a child circuit block desired in the computer assisted function and if so keeping the parent circuit block as part of the simplified hierarchical circuit model.

15. The method according to claim 14, further comprising maintaining a list of kept circuit blocks.

16. The method according to claim 1, further comprising instructions that, when executed on a programmed processor, carry out the computer assisted function on the hierarchical circuit model.

17. The method according to claim 1, wherein the computer assisted function comprises one of an analysis function, a simulation function and a design function.

18. A computer assisted method of simplifying a hierarchical circuit model represented by a hierarchy of interconnected circuit blocks, comprising:
    identifying at least one circuit block within the hierarchy of interconnected circuit blocks, as a target block of a computer assisted tool;
    carrying out an analysis of the target block included within the hierarchical circuit model to determine if the target block is a circuit block desired by the computer assisted tool and if so keeping the target block as part of a simplified hierarchical circuit model; and
    if not, carrying out a circuit block by circuit block analysis of the target block to determine if the target block includes any child blocks desired by the computer assisted tool and if so keeping each child block as part of the simplified hierarchical circuit model.

19. The computer assisted method according to claim 18, further comprising maintaining a list of kept circuit blocks.

20. The computer assisted method according to claim 18, further comprising preprocessing the hierarchical circuit model.

21. The computer assisted method according to claim 20, wherein preprocessing comprises logic-based simplification of the hierarchical circuit model.

22. The computer assisted method according to claim 21, wherein logic-based simplification of the circuit model comprises removing buffers.

23. The computer assisted method according to claim 21, wherein logic-based simplification of the hierarchical circuit model comprises collapsing serial inverter pairs.

24. The computer assisted method according to claim 21, further comprising performing connectivity analysis on the preprocessed circuit model.

25. The computer assisted method according to claim 24, wherein performing connectivity analysis comprises logic cone analysis.

26. The computer assisted method according to claim 18, further comprising performing connectivity analysis on the circuit model.

27. The computer assisted method according to claim 26, wherein performing connectivity analysis comprises logic cone analysis.

28. The computer assisted method according to claim 18, further comprising instructions, when executed on a programmed processor, for carrying out a method of computer assisted analysis for simplifying the hierarchical circuit model.

29. An electronic circuit analysis system, comprising
a processor;
means for storing a hierarchical circuit model of a circuit to be analyzed;
an input for receiving a list of desired circuit blocks for use in a computer assisted function; and
a program running on the processor that simplifies the hierarchical circuit model of the circuit to be analyzed to retain only the desired circuit blocks and circuit blocks containing the desired circuit blocks, to create a simplified hierarchical circuit model by performing:
inputting the hierarchical circuit model as a hierarchy of interconnected circuit blocks;
specifying at least one circuit block within the hierarchy of interconnected circuit blocks as a target block of the computer assisted function;
simplifying the hierarchical circuit model by deleting circuit blocks not affecting the function of the target block within the hierarchy of interconnected circuit blocks, to produce a simplified hierarchical circuit model.

30. The system according to claim 29, wherein the program carries out a circuit block by block analysis of the hierarchical circuit model to determine if a circuit block is a circuit block desired in the computer assisted function and if so keeping the circuit block as part of the simplified hierarchical circuit model; and carrying out a circuit block by circuit block analysis of the hierarchical circuit model to determine if a circuit block comprises a parent circuit block containing a child circuit block desired in the computer assisted function and if so keeping the parent circuit block as part of the simplified hierarchical circuit model.

31. The system according to claim 29, further comprising compiling a list of kept circuit blocks to create the simplified hierarchical circuit model.

32. The system according to claim 29, wherein inputting further comprises preprocessing the hierarchical circuit model.

33. The system according to claim 32, wherein preprocessing comprises logic-based simplification of the circuit model.

34. The system according to claim 32, wherein logic-based simplification of the hierarchical circuit model comprises removing buffers.

35. The system according to claim 34, wherein logic-based simplification of the hierarchical circuit model comprises collapsing serial inverter pairs.

36. The system according to claim 29, wherein specifying comprises performing connectivity analysis on the preprocessed circuit model.

37. The system according to claim 36, wherein connectivity analysis comprises logic cone analysis.

38. The system according to claim 29, wherein specifying comprises performing connectivity analysis on the hierarchical circuit model.

39. The system according to claim 38, wherein connectivity analysis comprises logic cone analysis.

40. The system according to claim 29, wherein specifying at least one circuit block further comprises specifying additional target blocks based on connectivity analysis of the existing target blocks.

41. The system according to claim 40, wherein connectivity analysis comprises logic cone analysis.

42. The system according to claim 29, wherein simplifying comprises carrying out a circuit block by circuit block analysis of the hierarchical circuit model to determine if a circuit block comprises a parent circuit block that contains a child circuit block desired in the computer assisted function and if so keeping the parent circuit block as part of the simplified hierarchical circuit model.

43. The system according to claim 29, wherein simplifying the hierarchical circuit model further comprises carrying out a circuit block by circuit block analysis of the hierarchical circuit model to determine if a circuit block is a circuit block desired in the computer assisted function and if so keeping the circuit block as part of the simplified hierarchical circuit model; and carrying out a circuit block by circuit block analysis of the hierarchical circuit model to determine if a circuit block comprises a parent circuit block containing a child circuit block desired in the computer assisted function and if so keeping the parent circuit block as part of the simplified hierarchical circuit model.

* * * * *